United States Patent
Kasprowicz et al.

(10) Patent No.: US 11,119,403 B2
(45) Date of Patent: Sep. 14, 2021

(54) PELLICLE FOR FLAT PANEL DISPLAY PHOTOMASK

(71) Applicant: PHOTRONICS, INC., Brookfield, CT (US)

(72) Inventors: Bryan S. Kasprowicz, Dallas, TX (US); Christopher Progler, Plano, TX (US)

(73) Assignee: Place Exchange, Inc., New York, NY (US)

( * ) Notice: Subject to any disclaimer, the term of this patent is extended or adjusted under 35 U.S.C. 154(b) by 123 days.

(21) Appl. No.: 16/568,365

(22) Filed: Sep. 12, 2019

(65) Prior Publication Data

US 2020/0081337 A1 Mar. 12, 2020

Related U.S. Application Data

(60) Provisional application No. 62/730,119, filed on Sep. 12, 2018.

(51) Int. Cl.
*G03F 1/64* (2012.01)
*G03F 1/38* (2012.01)
*G03F 1/62* (2012.01)

(52) U.S. Cl.
CPC .................. *G03F 1/64* (2013.01); *G03F 1/38* (2013.01); *G03F 1/62* (2013.01)

(58) Field of Classification Search
CPC .................. G03F 1/38; G03F 1/62; G03F 1/64
USPC ............................................................ 430/5
See application file for complete search history.

(56) References Cited

U.S. PATENT DOCUMENTS

| 6,524,754 B2 | 2/2003 | Eynon |
| 6,731,378 B2 | 5/2004 | Hibbs |
| 7,264,853 B2 | 9/2007 | Eschbach et al. |
| 8,449,966 B2 | 5/2013 | Sekihara |
| 2007/0037067 A1 | 2/2007 | Wang |

FOREIGN PATENT DOCUMENTS

WO 2014139592 A1 9/2014

OTHER PUBLICATIONS

International Search Report and the Written Opinion—International Application No. PCT/US2019/50733; dated Nov. 27, 2019.
Triggs, "Amoled vs LCD: Differences Explained," Android-Authority, Android Authority, Feb. 8, 2016, www.androidauthority.com/amoled-vs-lcd-differences-572859/.

*Primary Examiner* — Christopher G Young
(74) *Attorney, Agent, or Firm* — Amster, Rothstein & Ebenstein LLP

(57) ABSTRACT

A pellicle assembly for large-size photomasks including a frame member configured to be affixed to a large-size photomask substrate, a substantially rigid and transparent pellicle membrane affixed to the frame member so as to protect at least a portion of the large-size photomask substrate from contamination during usage, storage and/or transport, and a coating on at least one of top and bottom surfaces of the pellicle membrane that binds the pellicle membrane to prevent separation of pellicle membrane material in the event of breakage.

19 Claims, 2 Drawing Sheets

PELLICLE FOR FLAT PANEL DISPLAY PHOTOMASK

RELATED APPLICATIONS

This application claims priority to and the benefit of U.S. Provisional Application No. 62/730,119, filed Sep. 12, 2018, the contents of which are incorporated herein by reference in their entirety.

FIELD OF THE INVENTION

The present invention generally relates to photomask pellicles, and in particular to pellicles intended for use with large-size photomasks.

BACKGROUND

Flat-panel displays (FPDs) are electronic viewing technologies used to display content (e.g., still images, moving images, text, or other visual material) in a range of entertainment, consumer electronic, personal computer, and mobile devices, and many types of medical, transportation and industrial equipment. The current FPD types include, for example, LCD (Liquid Chrystal Display), AM LCD (Active Matrix Liquid Chrystal Display), OLED (Organic Light Emission Diode), LED (Light Emitting Diode), PDP (Plasma Display Panel) and AMOLED (Active Matrix OLED).

During manufacture of an FPD, an FPD lithography system irradiates light onto a photomask on which the original thin-film-transistor (TFT) circuit patterns are drawn, and the light exposes the patterns onto a glass plate substrate through a lens. On a large glass plate, the exposure process is repeated several times in order to form the patterns onto the entire plate.

Driven by end-user demands for better product quality and lower costs, FPD manufacturers are constantly searching for improved process equipment. Larger and thinner glass plates as well as tighter requirements lead to new challenges for equipment manufacturers. The glass plates are categorized by size and named by generations (GEN). For instance, Gen 8.5 glass plates have a size of 2200×2500 mm and can produce the panels needed for 55-inch LCD televisions. Photomasks must follow the size of FPD generations, because they are used as original plates to transfer patterns to TFT and color filter substrates.

As the size of photomasks used to manufacture large-size FPDs increases, a number of challenges arise in avoiding contamination of such photomasks by dust or other particles that might cause unwanted artifacts on the glass plate during the FPD lithography process. In this regard, conventional, smaller-sized photomasks may include a pellicle, which is a thin, transparent membrane or film that protects the photomask surface from contamination. However, the use of such pellicles with large-size photomasks requires an enhanced pellicle design that will function effectively over a large area.

SUMMARY OF THE INVENTION

A pellicle assembly for large-size photomasks according to an exemplary embodiment of the present invention comprises: a frame member configured to be affixed to a large-size photomask substrate; a substantially rigid and transparent pellicle membrane affixed to the frame member so as to protect at least a portion of the large-size photomask substrate from contamination during usage, storage and/or transport; and a coating on at least one of top and bottom surfaces of the pellicle membrane that binds the at least one of the top and bottom surfaces of the pellicle membrane to prevent separation of pellicle membrane material in the event of breakage.

In exemplary embodiments, the pellicle membrane is spaced from the photomask substrate by a distance of 3 mm to 20 mm.

In exemplary embodiments, the pellicle membrane is affixed to the frame member by adhesive.

In exemplary embodiments, the pellicle membrane is affixed to the frame member by a clamping mechanism.

In exemplary embodiments, the pellicle membrane has a transparency of at least 90% over a wavelength range of 190 nm to 500 nm.

In exemplary embodiments, the pellicle membrane has the following dimensions: outer dimension of 1146.0 mm×1366.0 mm and inner dimension of 1122.0 mm×1342.0 mm.

In exemplary embodiments, the pellicle membrane has the following dimensions: outer dimension of 1526.0 mm×1748.0 mm and inner dimension of 1493.0 mm×1711.0 mm.

In exemplary embodiments, the pellicle membrane has a thickness of 4 µm.

In exemplary embodiments, the pellicle membrane is made up of fused silica.

In exemplary embodiments, the coating meets wavelength requirements from 190 nm to 500 nm.

In exemplary embodiments, the pellicle assembly and photomask substrate are subjected to a compensation procedure within an exposure tool system to correct for any distortions induced by the pellicle.

In exemplary embodiments, the large-size photomask substrate is configured to manufacture a flat panel display.

In exemplary embodiments, the flat panel display is LCD (Liquid Chrystal Display), AM LCD (Active Matrix Liquid Chrystal Display), OLED (Organic Light Emission Diode), LED (Light Emitting Diode), PDP (Plasma Display Panel) or AMOLED (Active Matrix OLED).

These and other features and advantages of the present invention will be presented in more detail in the following detailed description and the accompanying figures which illustrate by way of example principles of the invention.

DESCRIPTION OF THE DRAWINGS

Various exemplary embodiments of this invention will be described in detail, with reference to the following figures, wherein.

DETAILED DESCRIPTION

Figure 1:
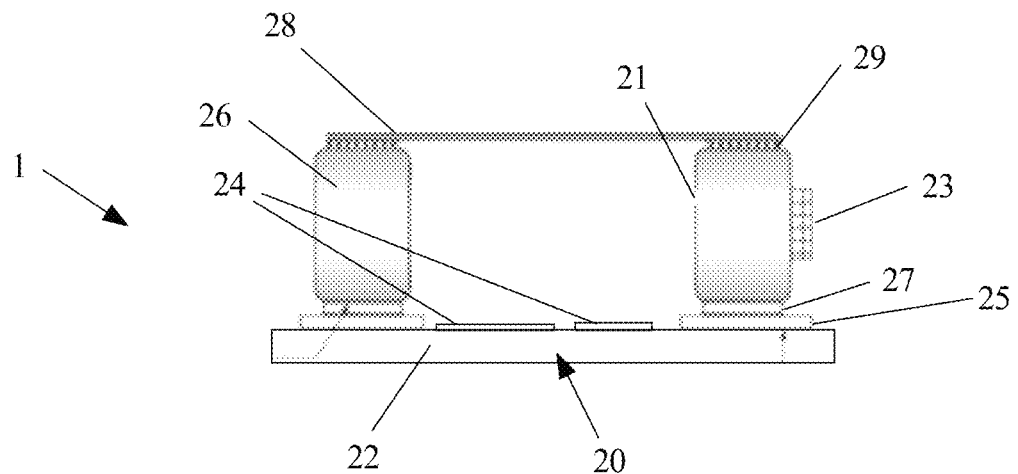
FIG. 1 is a cross-sectional view of a large-size photomask assembly according to an exemplary embodiment of the present invention.

FIG. 1 depicts a large-size photomask assembly, generally designated by reference number 1, configured in accordance with an exemplary embodiment of the present invention. The photomask assembly 1 includes a large-size photomask (or reticle) 20 comprised of a substantially transparent substrate 22 to which one or more patterned layers of masking material 24 are affixed. The patterned layer of masking material 24 represents a scaled image of the pattern desired to be created on a glass panel of an FPD. The substrate may be comprised of fused silica and the masking material may be comprised of chromium. In exemplary embodiments, other types of materials may be used to form the photomask so that the present invention is not limited for use with photomasks having fused silica substrates and chromium masking material. Further, in exemplary embodiments, the pellicle of the instant invention can be used in conjunction with all types of photomasks including, but not limited to, binary masks and phase shift masks (PSM).

The large-size photomask 20 may be appropriately sized to accommodate photolithography processing of glass plate substrates used to form FPDs. In accordance with an exemplary embodiment, the large-size photomask 20 has dimensions of 1220 mm×1400 mm for Generation 8.5 size glass plates (e.g., glass plates having dimensions of 2200 mm×2500 mm). In another exemplary embodiment, the photomask 20 has dimensions of 3400 mm×3000 mm for Generation 10.5 size glass plates (e.g., glass plates having dimensions of 3370 mm×2940 mm). In exemplary embodiments, the large-size photomask 20 may be appropriately sized for photolithographic processing up to Generation 10.5 glass plate substrates and beyond as technology advances. For example, the large size photomask 20 may have dimensions in the range of 390 mm×610 mm (Generation 3) to 3400 mm×3000 mm (Generation 10.5).

Figure 2:
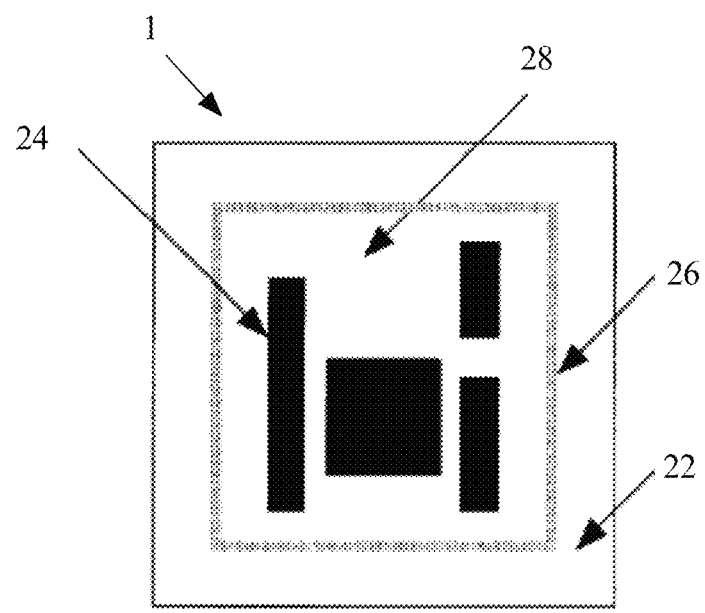
FIG. 2 is a top plan view of a large-size photomask assembly according to an exemplary embodiment of the present invention.
Figure 3:
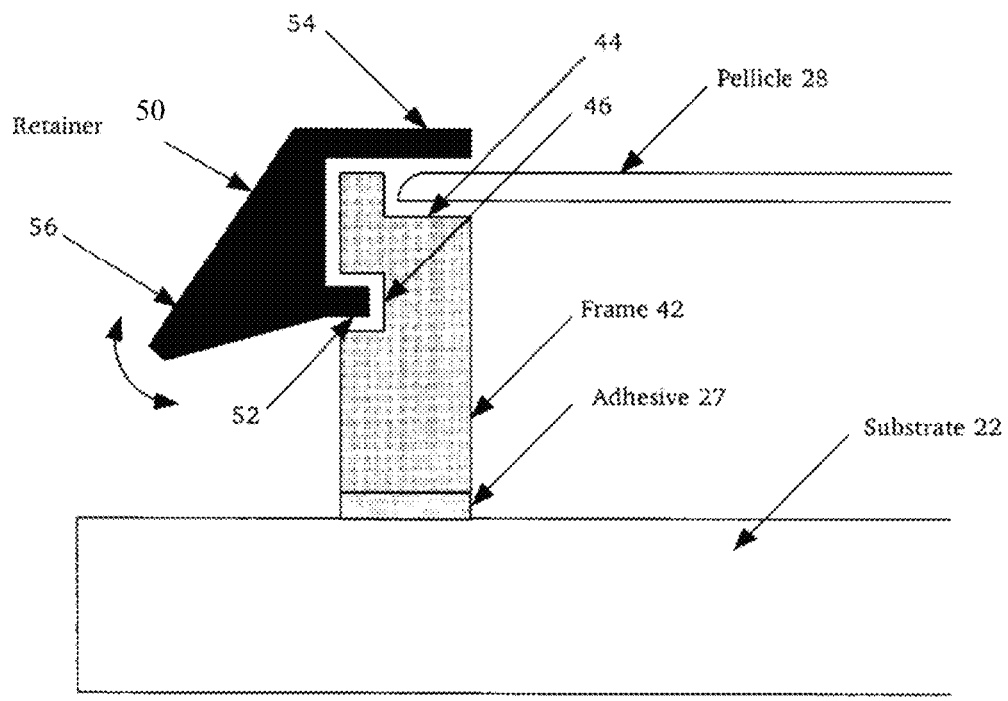
FIG. 3 is a partial cross-sectional view of a large-size photomask assembly according to an exemplary embodiment of the present invention.

As further shown in FIG. 2, photomask 20 also includes a pellicle frame or ring 26 which extends around the perimeter of the patterned masking material 24. In an exemplary embodiment, frame 26 is made of anodized aluminum alloy, however, other materials may be used as well. Although shown as a continuous ring, in exemplary embodiments the frame 26 may have other shapes and may include various gaps or vents to ensure that pressure within the gap between pellicle and photomask comes to equilibrium at the end user site. Frame 26 is affixed to substrate 22 using adhesive 27, such as, for example, hot-melt adhesive (HMA). In an exemplary embodiment, the HMA is styrene polymer. A liner 25 may be disposed between the adhesive 27 and the surface of the photomask substrate 22. In an exemplary embodiment, the liner 25 is a polyester film.

In exemplary embodiments, the frame 26 may include one or more vents 21 configured to allow for equalization of pressure between the interior space formed below the pellicle membrane 28 and atmosphere. Each vent 23 may include a filter 23 that allows air and/or other gasses to pass through while filtering out particles.

The photomask assembly 1 further includes a pellicle membrane 28 disposed over the photomask 20. In this regard, the pellicle membrane 28 may be affixed to the frame 26 by an adhesive 29, such as, for example, a UV-curable adhesive. In an exemplary embodiment, the adhesive 29 used to affix the pellicle membrane 28 to the frame 26 has sufficient mechanical strength so as to withstand 30 psi air blow at a 1 inch distance. The pellicle membrane 28 generally conforms to the dimensions of the frame 26. One or more of the edges or corners of the pellicle membrane 28 may be beveled or rounded for safety reasons.

The pellicle membrane 28 may be coated with one or more anti-reflective materials to give it suitable anti-reflective properties. The anti-reflective coating process can be done by spin-coating or vacuum deposition with low refractive index materials, examples of which include fluoropolymers, thin layers of oxides and oxynitrides such as TaO and TaON. In exemplary embodiments, the pellicle membrane 28 may include a coating that binds the surface to prevent the pellicle material from separating in the event of breakage. This coating preferably meets wavelength requirements from 190 nm to 500 nm.

In exemplary embodiments, the pellicle membrane 28 is made of cellulose ester or perfluoropolymer. In other exemplary embodiments, the pellicle membrane 28 may be a flat, polished, low birefringence slice of fused silica, as described in U.S. Pat. No. 6,524,754, the entire contents of which are incorporated herein by reference. The fused silica material used to form the pellicle membrane 28 may have the properties listed in Table 1.

TABLE 1

| Fused Silica Material Properties | | | |
|---|---|---|---|
| | Units of Measure | SUMetrIc | (Imperial) |
| Mechanical | | | |
| Density | gm/cc (lb/fe$^3$) | 2.2 | (137.4) |
| Porosity | % (%) | 0 | 0 |
| Color | — | clear | — |
| Flexural Strength | MPa (lb/in$^2$ × 10$^3$) | — | — |
| Elastic Modulus | GPa (lb/in$^2$ × 10$^6$) | 73 | (10.6) |
| Shear Modulus | GPa (lb/in$^2$ × 10$^6$) | 31 | (4.5) |
| Bulk Modulus | GPa (lb/in$^2$ × 10$^6$) | 41 | (6) |
| Poisson's Ratio | — | 0.17 | (0.17) |
| Compressive Strength | MPa (lb/in$^2$ × 10$^3$) | 1108 | (160.7) |
| Hardness | Kg/mm$^2$ | 600 | — |
| Fracture Toughness $K_{IC}$ | MPa · n$^{1/2}$ | — | — |
| Maximum Use Temperature (no load) | ° C. (° F.) | 1100 | (2000) |
| Thermal | | | |
| Thermal Conductivity | W/m · °K (BTU · in/ft$^2$ · hr · ° F.) | 1.38 | (9.6) |
| Coefficient of Thermal Expansion | 10$^{-6}$/C. (10$^{-6}$/° F.) | 0.55 | (.31) |
| Specific Heat | J/Kg · ° (Btu/lb · ° F.) | 740 | (0.18) |

TABLE 1-continued

Fused Silica Material Properties

|  | Units of Measure | SI Metric | (Imperial) |
|---|---|---|---|
| Electrical |  |  |  |
| Dielectric Strength | ac-kv/mm ((volts/mil)) | 30 | (750) |
| Dielectric Constant | @ 1 MHz | 3.82 | (3.82) |
| Dissipation Factor | @ 1 MHz | 0.00002 | (0.00002) |
| Loss Tangent | @ 1 MHz | — | — |
| Volume Resistivity | ohm · cm | >$10^{10}$ | — |

In exemplary embodiments, the pellicle membrane 28 preferably has a transmittance of ≥90% over a wavelength range of 190 nm to 500 nm with a stand off distance of 3 mm to 20 mm, and filters out particles that are ≥10 μm in size.

In an exemplary embodiment, in order to accommodate Generation 8.5 glass plate substrates, the pellicle membrane 28 may have one or more of the following characteristics: outer dimension of 1146.0 mm×1366.0 mm (+0.0, −4.0); inner dimension of 1122.0 mm×1342.0 mm (+0.0, −4.0); pellicle thickness of 4 μm (±0.2 μm); pellicle transmittance of ≥95% (average between 360 nm and 440 nm); pellicle frame material is aluminum alloy (black anodized); stand off of 7.0 mm (±0.2 mm). For the purposes of the present disclosure, the term "inner dimension" of the pellicle membrane may be defined as an orthogonal measurement of the inner most parts of the frame and the "outer dimension" of the pellicle membrane may be defined as an orthogonal measurement of the outer most parts of the frame.

In an exemplary embodiment, in order to accommodate Generation 10.5 glass plate substrates, the pellicle membrane 28 may have one or more of the following characteristics: outer dimension of 1526.0 mm×1748.0 mm (+0.0, −4.0); inner dimension of 1493.0 mm×1711.0 mm (+0.0, −4.0); pellicle thickness of 4 μm; pellicle transmittance of ≥95% (average between 360 and 440 nm); pellicle frame material is aluminum alloy (black anodized); stand off of 8.0 mm (±0.2 mm).

In exemplary embodiments, the pellicle membrane 28 may be secured to the frame using a removable frame assembly so that the pellicle can be easily removed and cleaned. For example, as shown in the cross-sectional view of FIG. 2, frame 42 made from anodized aluminum is affixed to substrate 22 by means of an adhesive, applicable types of which being well known in the art. Those skilled in the art will understand frame 42 can be made from materials other than anodized aluminum. In the preferred embodiment frame 42 extends around the entire perimeter of the patterned masking material, however, frame 42 need not be contiguous and may include one or more gaps. Frame 42 includes a first receptive area 44 which forms a shelf parallel to the surface of substrate 22 for receiving the lower surface of the outer edges of pellicle 28. Frame 42 also includes a second receptive area or detent 46 which receives lower protrusion 52 of flexible retainer 50 which may be constructed from a variety of materials including plastics and polytetrafluoroethylene (e.g., Teflon). An upper protrusion 54 of retainer 50 extends over the first receptive area 44 of frame 42 and over the upper surface of the outer edge of pellicle 28 thereby holding pellicle 28 securely in place. Accordingly, in this embodiment there may be no need for adhesive to affix the pellicle to the frame. For aid in the installation and removal of flexible retainer 50, the corners of retainer 50 may include flexible tabs 56. When an upward force is exerted on flexible tabs 56, lower protrusion 52 is decoupled from second receptive area 46 of frame 42. With lower protrusion 52 decoupled from frame 42, retainer 50 can be removed thereby enabling pellicle 28 to be removed as well.

In this embodiment, no vent is necessary in frame 42 since pressure can be relieved through the gaps between frame 42, pellicle 28, and retainer 50. Additionally, since no adhesive is used to secure the pellicle to the frame, the pellicle can be more readily removed, cleaned, and/or replaced.

Figure 4:
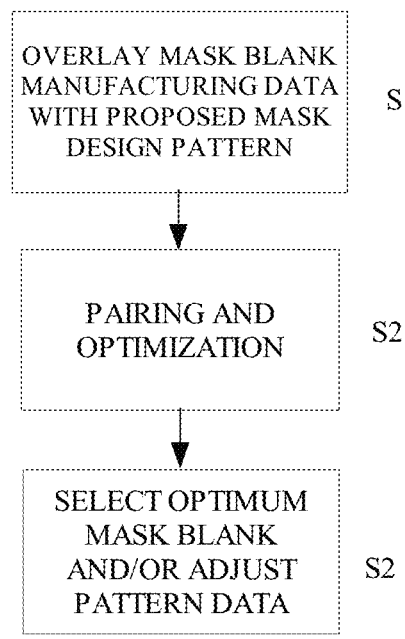
FIG. 4 is a flowchart of a process for compensating for mask or pellicle weight induced distortions according to an exemplary embodiment of the present invention.

In exemplary embodiments, compensation within or on the pellicle membrane material itself may be used to correct for mask or pellicle weight induced distortions. In this regard, finished blanks may be paired with flat panel design layers to optimize flat panel mask manufacturing. Large area mask blank manufacturing data may be used along with required display lithography pattern design data and an understanding of the mask and lithographic process to pair and tune finished blanks to design for mask making optimization and yield improvement. As shown in FIG. 4, in exemplary embodiments, this process may involve one or more of the following steps:

Step S1: Actual mask blank manufacturing data including but not limited to blank flatness, defects (size and placement), film properties are overlaid with the proposed mask design pattern;

Step S2: Pairing and optimization is performed. This pairing and optimization may include shifting and adjustment of flat panel lithography design data to best match with the measured blank characteristics with aim to improve finished mask yield and performance in the intended application. The pairing and optimization may be performed by simulating the overlay of manufactured blank or blanks properties with the intended design data.

Step S3: An optimum blank is selected from a batch based on the simulation for the specific use and/or the pattern data may be scaled, tuned, embellished, rotated or otherwise manipulated to be compatible with the proposed blank to be used in the flat panel mask making operation.

Once the blank and mask design pattern elements are optimally merged then the mask is committed to manufacturing using the selected blank and the optimization parameters. The subsequent mask manufacturing process may access and track the overlaid mask-blank conditions, and the inspection and other mask making steps for flat panel display masks may use these conditions to tune or optimize the manufacturing flow.

While in the foregoing specification a detailed description of a specific embodiment of the invention was set forth, it will be understood that many of the details herein given may be varied considerably by those skilled in the art without departing from the spirit and scope of the invention.

The invention claimed is:

1. A pellicle assembly for large-size photomasks, comprising:
   a frame member configured to be affixed to a large-size photomask substrate;
   a substantially rigid and transparent pellicle membrane affixed to the frame member so as to protect at least a portion of the large-size photomask substrate from contamination during usage, storage and/or transport; and
   a coating on at least one of top and bottom surfaces of the pellicle membrane that binds the at least one of the top and bottom surfaces of the pellicle membrane to prevent separation of pellicle membrane material in the event of breakage.

2. The pellicle assembly of claim 1, wherein the pellicle membrane is spaced from the photomask substrate by a distance of 3 mm to 20 mm.

3. The pellicle assembly of claim 1, wherein the pellicle membrane is affixed to the frame member by adhesive.

4. The pellicle assembly of claim 1, wherein the pellicle membrane is affixed to the frame member by a clamping mechanism.

5. The pellicle assembly of claim 1, wherein the pellicle membrane has a transparency of at least 90% over a wavelength range of 190 nm to 500 nm.

6. The pellicle assembly of claim 1, wherein the pellicle membrane has the following dimensions: outer dimension of 1146.0 mm×1366.0 mm and inner dimension of 1122.0 mm×1342.0 mm.

7. The pellicle assembly of claim 1, wherein the pellicle membrane has the following dimensions: outer dimension of 1526.0 mm×1748.0 mm and inner dimension of 1493.0 mm×1711.0 mm.

8. The pellicle assembly of claim 1, wherein the pellicle membrane has a thickness of 4 μm.

9. The pellicle assembly of claim 1, wherein the pellicle membrane is made up of fused silica.

10. The pellicle assembly of claim 1, wherein the coating meets wavelength requirements from 190 nm to 500 nm.

11. The pellicle assembly of claim 1, wherein the pellicle assembly and photomask substrate are subjected to a compensation procedure within an exposure tool system to correct for any distortions induced by the pellicle.

12. The pellicle assembly of claim 1, wherein the large-size photomask substrate is configured to manufacture a flat panel display.

13. The pellicle assembly of claim 10, wherein the flat panel display is LCD (Liquid Chrystal Display), AM LCD (Active Matrix Liquid Chrystal Display), OLED (Organic Light Emission Diode), LED (Light Emitting Diode), PDP (Plasma Display Panel) or AMOLED (Active Matrix OLED).

14. A large-size photomask assembly, comprising:
   a large-size photomask configured to form a lithographic pattern on Generation 8.5 glass plates;
   a frame member configured to be affixed to the large-size photomask;
   a substantially rigid and transparent pellicle membrane affixed to the frame member so as to protect at least a portion of the large-size photomask from contamination during usage, storage and/or transport; and
   a coating on at least one of top and bottom surfaces of the pellicle membrane that binds the at least one of the top and bottom surfaces of the pellicle membrane to prevent separation of pellicle membrane material in the event of breakage.

15. The large-size photomask assembly of claim 14, wherein the large-size photomask has dimensions of 1220 mm×1400 mm.

16. The large-size photomask assembly of claim 14, wherein the pellicle membrane has the following dimensions: outer dimension of 1146.0 mm×1366.0 mm and inner dimension of 1122.0 mm×1342.0 mm.

17. A large-size photomask assembly, comprising:
   a large-size photomask configured to form a lithographic pattern on Generation 10.5 glass plates;
   a frame member configured to be affixed to the large-size photomask;
   a substantially rigid and transparent pellicle membrane affixed to the frame member so as to protect at least a portion of the large-size photomask from contamination during usage, storage and/or transport; and
   a coating on at least one of top and bottom surfaces of the pellicle membrane that binds the at least one of the top and bottom surfaces of the pellicle membrane to prevent separation of pellicle membrane material in the event of breakage.

18. The large-size photomask assembly of claim 17, wherein the large-size photomask has dimensions of 3400 mm×3000 mm.

19. The large-size photomask assembly of claim 17, wherein the pellicle membrane has the following dimensions: outer dimension of 1526.0 mm×1748.0 mm and inner dimension of 1493.0 mm×1711.0 mm.

* * * * *

UNITED STATES PATENT AND TRADEMARK OFFICE
CERTIFICATE OF CORRECTION

PATENT NO. : 11,119,403 B2  
APPLICATION NO. : 16/568365  
DATED : September 14, 2021  
INVENTOR(S) : Bryan S. Kasprowicz and Christopher Progler Page 1 of 1

It is certified that error appears in the above-identified patent and that said Letters Patent is hereby corrected as shown below:

On the Title Page  
Under item (73) Assignee:  
"Place Exchange, Inc., New York, NY (US)"  
Should be changed to:  
--Photronics, Inc., Brookfield, CT (US)--

Signed and Sealed this  
Twenty-ninth Day of March, 2022

Drew Hirshfeld  
*Performing the Functions and Duties of the*  
*Under Secretary of Commerce for Intellectual Property and*  
*Director of the United States Patent and Trademark Office*